United States Patent [19]

Milkovic

[11] Patent Number: 4,800,333
[45] Date of Patent: Jan. 24, 1989

[54] SWITCHED-CAPACITOR WATTHOUR METER CIRCUIT HAVING REDUCED CAPACITOR RATIO

[75] Inventor: Miran Milkovic, Scotia, N.Y.

[73] Assignee: General Electric Company, Schenectady, N.Y.

[21] Appl. No.: 212,115

[22] Filed: Jun. 24, 1988

Related U.S. Application Data

[63] Continuation of Ser. No. 947,114, Dec. 29, 1986, abandoned.

[51] Int. Cl.[4] .................. G01R 21/127; G01R 21/133
[52] U.S. Cl. .................................. 324/142; 364/841; 364/844
[58] Field of Search ................. 324/142; 364/841, 844

[56] References Cited

U.S. PATENT DOCUMENTS

| | | | |
|---|---|---|---|
| 3,875,508 | 4/1975 | Milkovic | 324/142 |
| 3,955,138 | 5/1976 | Milkovic | 324/107 |
| 4,066,960 | 1/1978 | Milkovic | 324/142 |
| 4,217,546 | 8/1980 | Milkovic | 324/142 |
| 4,393,351 | 7/1983 | Gregorian et al. | 328/127 |
| 4,463,311 | 7/1984 | Kobayashi | 324/142 |
| 4,485,343 | 11/1984 | Milkovic | 324/142 |
| 4,495,463 | 1/1985 | Milkovic | 324/142 |
| 4,535,287 | 8/1985 | Milkovic | 324/142 |
| 4,615,009 | 9/1986 | Battocletti et al. | 324/142 X |
| 4,682,102 | 7/1987 | Milkovic | 324/142 |

FOREIGN PATENT DOCUMENTS

| | | | |
|---|---|---|---|
| 2739709 | 3/1978 | Fed. Rep. of Germany | 324/142 |
| 2919694 | 11/1980 | Fed. Rep. of Germany | 324/142 |
| 2929408 | 2/1981 | Fed. Rep. of Germany | 324/142 |

Primary Examiner—Jerry Smith
Assistant Examiner—Stephen M. Baker
Attorney, Agent, or Firm—Marvin Snyder; James C. Davis, Jr.

[57] ABSTRACT

An electronic energy consumption measuring circuit capable of being fabricated on a single integrated circuit chip employs a switched-capacitor integrator for integrating the product of first and second voltages which are proportional, respectively, to load voltage and current in an electrical system to provide a measure of the energy being consumed, and a hysteresis comparator for converting the integrator output into a pulse train wherein each pulse represents a predetermined amount of energy. The output pulses may be accumulated and displayed to provide an indication of total energy consumed. A divider at the hysteresis comparator output enables the capacitor ratio in the switched-capacitor integrator to be reduced substantially so that the capacitor values are approximately the same order of magnitude. This reduces the chip area necessary for fabricating the capacitors and improves the matching between the capacitors, thereby affording higher integration accuracy.

15 Claims, 2 Drawing Sheets

SWITCHED-CAPACITOR WATTHOUR METER CIRCUIT HAVING REDUCED CAPACITOR RATIO

This application is a continuation of application Ser. No. 947,114, filed Dec. 29, 1986, now abandoned.

BACKGROUND OF THE INVENTION

This invention relates generally to electronic energy consumption metering circuits, and more particularly to electronic metering circuits which employ switched-capacitor integrators and which may be fabricated on a single integrated circuit chip.

Electronic circuits for measuring electrical energy consumption in an electrical system, such as an AC power distribution system, are well known. Typically, these circuits may comprise a switched time division multiplier for multiplying two signals representative of the instantaneous current and voltage in the electrical system and for providing a product signal which is representative of the instantaneous power being supplied by the electrical system. The product signal from the multiplier may be integrated in an integrator circuit to provide a signal representative of the average power or energy consumption, and this signal may be converted to a pulse train in which each pulse represents a predetermined unit quantity of energy. The pulses may be counted or accumulated to provide a measure of total energy consumption. This basic technique of electronic metering is described, for example, in U.S. Pat. No. 3,955,138 which issued to the present inventor, and various electronic metering circuits employing this technique are disclosed in other patents of the present inventor, including U.S. Pat. Nos. 4,066,960; 4,217,546; 4,485,343; 4,495,463; and 4,535,287. The foregoing patents are all commonly assigned with the present invention to General Electric Company, and are incorporated by reference herein.

While the electronic circuits disclosed in the foregoing applications are capable of accurate metering and perform satisfactorily, it is desirable to provide electronic metering circuits which have improved accuracy, reduced cost and size, and which are capable of being fabricated entirely on a solid state semiconductor monolithic integrated circuit chip. In the past, electronic metering circuits have been fabricated, at least in part, on integrated circuit chips. It is relatively easy to fabricate components such as analogue switches, amplifiers, logic elements, etc. on silicon chips using, for example, MOS technology. Some difficulties have been encountered, however, in attempts to fabricate electronic metering circuits entirely on integrated circuit chips. For example, in order to afford the desired degree of metering accuracy, close matching and control of the values of some resistor and capacitor components are necessary, and this has generally required the use of precision components. It is very difficult to control characteristics such as value and temperature coefficient of integrated circuit resistors, and obtaining well-matched components in circuits such as R-C integrators where close matching is necessary for good accuracy has been practically impossible. Furthermore, MOS resistors have a low sheet resistance, and to obtain resistors having a large value requires a large chip area. Since it is easier to match the temperature and voltage coefficienss of integrated circuit capacitors and obtain a desired capacitance ratio, it has been proposed to replace the conventional R-C type of integrator of known electronic metering circuits with a switched-capacitor type integrator. The present inventor's commonly assigned copending application Ser. No. 812,369, filed Dec. 23, 1985, now U.S. Pat. No. 4,682,102 discloses an electronic metering circuit employing a switched-capacitor integrator that is capable of being fabricated on a single chip, which application is incorporated by reference herein. Although the electronic circuit of the copending application is quite satisfactory, the ratio of the capacitors in the switched-capacitor integrator is quite large. This has made it difficult to match the capacitors and has necessitated a relatively large chip area for fabrication. It is desirable to reduce the capacitor ratio in the switched-capacitor integrator of such electronic metering circuit in order to reduce the chip area and to improve the capacitor matching, and it is to this end that the present invention is directed.

SUMMARY OF THE INVENTION

The present invention affords an electronic metering circuit employing a switched-capacitor integrator which has a substantially reduced capacitor ratio so that the values of the capacitors are generally of the same order of magnitude. This facilitates fabrication of the switched-capacitor integrator on an integrated circuit chip since it substantially reduces the chip area required when the capacitor values differ by several orders of magnitude, and significantly improves the matching between the capacitors. Moreover, the invention enables the integration speed to be increased by the same factor by which the capacitor ratio is reduced, and improves metering accuracy.

Briefly stated, in one aspect the invention affords an electronic circuit for measuring the energy consumption in an electrical system that comprises input means for first and second signals representative, respectively, of the current and voltage in the electrical system; means for multiplying the first and second signals to provide a product signal representative of the power being supplied by the electrical system; switched-capacitor integrator means for integrating the product signal and for providing an integrated signal representative of the average energy; means for converting the integrated signal into a first train of signal pulses; and divider means for dividing the first train of signal pulses by a preselected ratio and for providing a second train of output signal pulses, wherein each output signal pulse represents a predetermined amount of electric energy consumed in the electrical system.

In another aspect, the invention provides, on a semiconductor chip, an electronic circuit for measuring energy consumption in an electrical system that comprises input means for first and second signals representative, respectively, of the current and voltage in the electrical system; means for multiplying the first and second signals together to provide a product signal representative of the power supplied by the electrical system; switched-capacitor integrator means for integrating the product signal to provide an integrated signal corresponding to the time integral of the product signal and representative of average energy; first means for converting the integrated signal into a first train of pulses, each pulse of which represents a preselected fraction of a predetermined quantity of energy; and second means for converting the first train of pulses into a second train of pulses such that each pulse of the second train represents said predetermined quantity of energy and is indicative of energy consumption of that quantity.

In yet another aspect, the invention affords an electronic circuit which comprises first input means for a first signal representative of the current in the electrical system; second input means for a second signal representative of the voltage in the electrical system; time division multiplier means for multiplying the first and second signals and for providing a product signal representative of the power being supplied by the electrical system; switched-capacitor integrator means for integrating the product signal and for providing an integrated signal representative of average energy, the switched-capacitor integrator means comprising an amplifier having an input and an output, a first capacitor connected between the input and the output, and switching means for connecting a second capacitor to the input of the amplifier and to the output of the time division multiplier means; analog-to-pulse rate converter means for converting the integrated signal from the switched-capacitor integrator means to a first train of signal pulses; and divider means for dividing the first train of signal pulses by a preselected ratio and for providing a second train of output signal pulses, wherein each output signal pulse represents a predetermined amount of electrical energy and is indicative of such amount of energy consumed in the electrical system.

By dividing the signal pulses from the analog-to-pulse rate converter means by a preselected ratio, such as 100, so that the pulse repetition frequency of the output signal pulses is divided by the same factor and each pulse represents a predetermined amount of electrical energy, the ratio of the capacitors in the switched-capacitor integrator means is reduced by this factor and the integration speed is increased by this factor. This affords better capacitor matching and improved integration accuracy. Moreover, the reduction in capacitor ratio affords a substantial reduction in the area of the chip required for fabrication of the capacitors.

DESCRIPTION OF THE PREFEREED EMBODIMENT

The present invention is especially well adapted for fabrication in integrated circuit form and for measuring energy consumption, as in watthours, for example, in an electrical system such as a single or polyphase AC power distribution system, and will be described in that context. However, as will become apparent, this is illustrative of only one utility of the invention.

Figure 1:
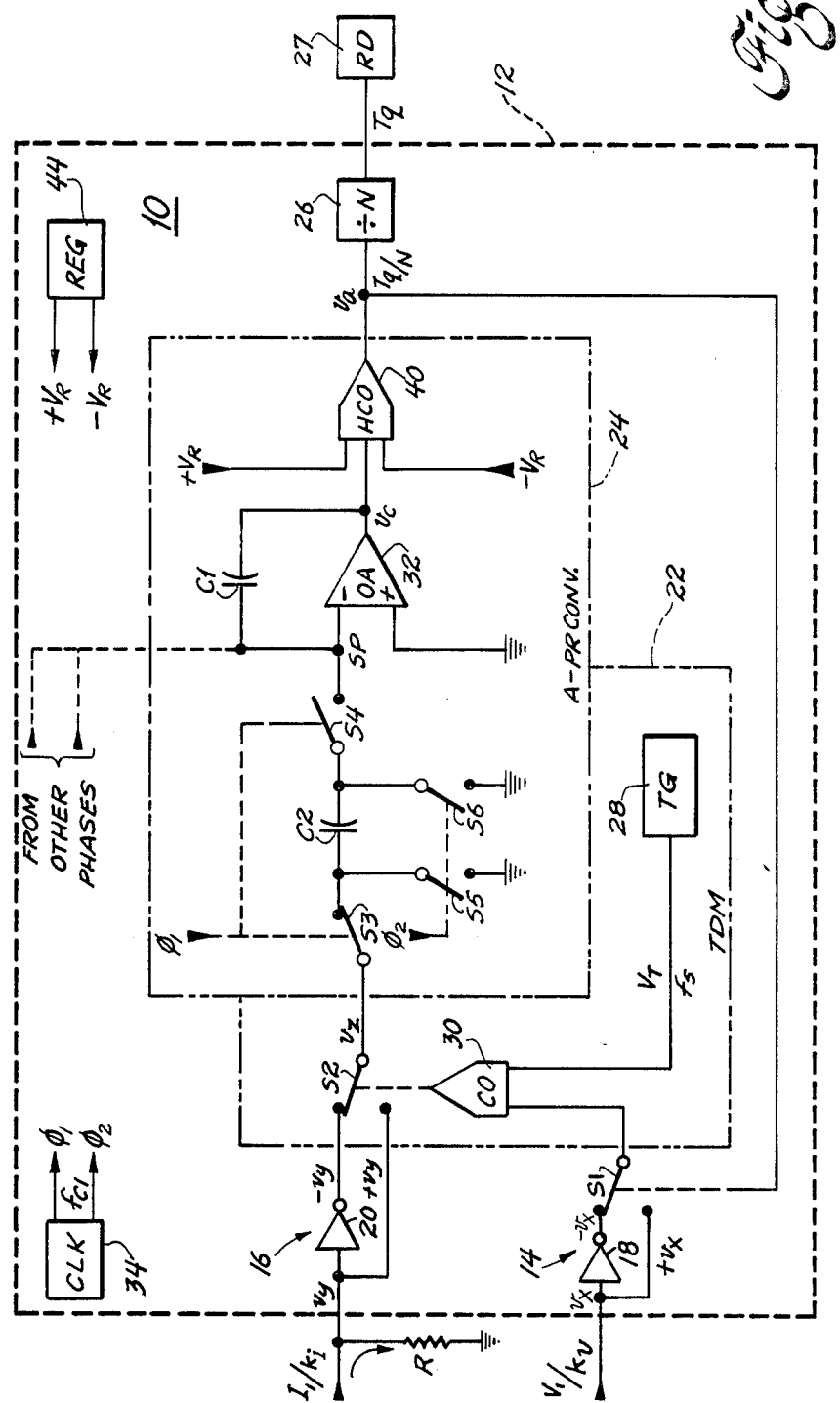
FIG. 1 is a schematic diagram of a switched-capacitor energy consumption metering circuit in accordance with the invention which is particularly well adapted to be fabricated on an integrated circuit chip.

FIG. 1 is an electrical schematic diagram of a preferred form of an energy consumption metering circuit 10 in accordance with the invention for measuring the energy consumption (in watthours, for example) in a load connected to an AC power distribution system (not illustrated). As will be described in more detail shortly, circuit 10 may be fabricated in integrated circuit form, preferably on a single monolithic MOS semiconductor integrated circuit chip 12. The load voltage $V_l$ and the load current $I_l$ in the electrical system may be sensed by conventional means, and corresponding voltages $v_x$ and $v_y$ which are proportional to the load voltage and load current, respectively, may be supplied to corresponding input circuits 14 and 16 of circuit 10. Voltage $v_x$ may be derived, for example, from the secondary of a voltage transformer (not illustrated) which is connected across the voltage lines of one phase of the electrical system and may be equal to $V_l/k_v$ where $k_v$ is a proportionality constant. Voltage $v_y$ may comprise the voltage developed across a sensing resistor R due to a current $I_l/k_i$ flowing through the resistor from a current transformer (not illustrated) which monitors the load current, where $k_i$ is a proportionality constant. Input circuit 14 may comprise a line for supplying the voltage $v_x$ to a first terminal of an analog switch S1, and an inverter amplifier 18 for inverting the voltage and supplying a voltage $-v_x$ to a second terminal of the switch. Similarly, input circuit 16 may supply the voltage $v_y$ to a first terminal of another analog switch S2, and include another inverter amplifier 20 for supplying an inverted voltage $-v_y$ to a second terminal of switch S2. As will be described in more detail shortly, circuit 10 may further comprise a time division multiplier (TDM) 22 for multiplying the voltages $v_x$ and $v_y$ (or inverted forms thereof) together to form a voltage $v_z$ at the output of switch S2 which corresponds to the product of the two input voltages. Since the two input voltages $v_x$ and $v_y$ are proportional, respectively, to the instantaneous load voltage and load current, their product, $v_z$, is proportional to the instantaneous power being supplied by the electrical system. The signal $v_z$ may be then integrated to convert it into a signal proportional to average energy and quantized into a train of signal pulses, each pulse of which represents a predetermined amount of energy, in an analog-to-pulse rate converter 24. The voltage $v_a$ from the analog-to-pulse rate converter may be supplied to a divider 26, such as a binary divider, which divides the pulse train by a factor N. The pulses from the divider may be accumulated or counted and displyed in a register/display (RD) 27 to provide an indication of energy consumption.

Time division multiplier 22 may comprise a triangular waveform sampling frequency generator (TG) 28, which will be described in more detail in connection with FIG. 2, a comparator (CO) 30, and switch S2. The comparator receives at a first input either the voltage $+v_x$ or the voltage $-v_x$ from switch S1, and receives at a second input a triangular waveform voltage $V_T$ having a frequency $f_s$ from the sampling frequency generator 28. Comparator 30 constitutes a pulse-width modulator which provides pulse-width modulated pulses, wherein the instantaneous pulse width of an output pulse is proportional to the corresponding instantaneous magnitude of the input voltage from switch S1. The pulse width modulated output of the comparator is employed for controlling the position of switch S2 so that the output voltage $v_z$ from the switch comprises a train of pulses which alternate in polarity wherein the instantaneous magnitude of any given pulse is proportional to the line current while the instantaneous width or mark-space ratio of the pulses is proportional to the line voltage. Thus $v_z$ is proportional to the instantaneous power, as explained, for example, in the afore-referenced U.S. Pat. No. 3,955,138. The output product, $v_z$, from time division multiplier 22 is preferably provided about 100 times for each period of the line frequency. Accordingly, for a 60 Hz line frequency, the sampling frequency $f_s$ provided by sampling frequency generator 28 is preferably of the order of 6 KHz.

In analog-to-pulse rate converter 24, the product signal $v_z$ is preferably integrated in a switched-capacitor integrator comprising an operational amplifier (OA) 32, a feedback capacitor C1, an input capacitor C2, and analog switches S3, S4, S5, and S6. The switches may be controlled in pairs (as indicated by the dotted lines) by clock signals $\phi_1$, $\phi_2$ which are derived from a clock generator (CLK) 34. The clock signals are non-overlapped and 180 degrees out of phase. The frequency $f_{c1}$ of the clock signals is preferably high in relation to the frequency $f_s$ of sampling frequency generator 28, and may be, for example, of the order of 30 KHz. As shown in the figure, switches S3 and S4 are operated together and alternately with switches S5 and S6 to connect capacitor C2 alternately to the output of switch S2 and to the non-inverting (−) input of operational amplifier 32, and to ground. Switches S3–S6, in combination with capacitor C2, effectively constitute a sampling circuit which samples the signal $v_z$ and supplies the sampled signal to the operational amplifier. This signal is integrated up in C1. Thus the output voltage $v_c$ of operational amplifier 32 is a ramp signal with a constant slope formed by superimposed small steps due to sample integration. In addition, a $2\omega t$ component is superimposed upon the ramp signal due to the effect of multiplication of the input voltages. This component, however, is cancelled out in balanced polyphase loads. The output signal $v_c$ from the integrator is thus the time integral of the input voltage $v_z$ with a time constant of (C1/C2) $T_{c1}$, where $T_{c1} = 1/f_{c1}$, and $v_c$ represents the average energy being consumed in the electrical system.

Signal $v_c$ from the integrator may be quantized and converted into a train of signal pulses by a hysteresis comparator (HCO) 40 wherein each output pulse represents a predetermined quantity of energy. As described, for example, in the afore-referenced U.S. Pat. No. 3,955,138, the hysteresis comparator may comprise a pair of comparators connected in parallel, each receiving at one input thereof the output voltage from the integrator. One of the comparators may receive at another input thereof a reference voltage $+V_R$ and provide an output to the set input of a flip-flop. The second comparator may receive another reference voltage $-V_R$ and provide an output to the reset input of the flip-flop. During a first time period, $T_u$, the integrator may integrate the signal $v_z$ upwardly so that the output ramp voltage $v_c$ from the integrator increases. When this voltage reaches the positive reference voltage, the flip-flop may be set so that the hysteresis comparator output may go high to produce an output pulse. This pulse may be supplied back to switch S1 to control the switch so as to reverse the polarity of the input voltage $v_x$ to comparator 30 of the time division multiplier. This reverses the polarity of the product signal $v_z$ so that the integrator starts to integrate downwardly during a next time period $T_d$. Upon the output signal from the integrator reaching the negative reference voltage, the hysteresis comparator changes state by going low, which again reverses the input voltage to comparator 30 so that the integrator starts to integrate upwardly again. The hysteresis comparator output $v_a$ is thus a pulse train where each pulse represents a predetermined amount of energy measured, for example, in watthours. The energy per output pulse is $$W_q = (4V_R^2/kf_{cl})\ (C1/C2)\ \text{(Joules)} \qquad (1)$$

and the output pulse rate is $$1/T_q = (kf_{c1}/4V_R^2)\ (C2/C1)\ VI\cos\theta\ (1/\text{sec}) \qquad (2)$$

where k is a dimensional constant in ohms, $VI\cos\theta$ is the power in the load, $V_R$ is a reference voltage, and $f_{cl}$ is the clock frequency.

From Equation (1), it can be seen that the energy per output pulse depends only on the clock frequency $f_{c1}$, on $V_R$, and on the ratio C1/C2. Thus, the accuracy with which the energy may be measured depends upon the accuracy of these terms. The clock frequency may be derived from the line frequency of the electrical system, as by using conventional phase lock loop techniques, and since the line frequency of AC power distribution systems is, on the average, stable to within ±0.1, the clock frequency would have the same accuracy. The reference voltage $V_R$ may be derived from a voltage regulator (REG) 44 fabricated directly on chip 12, and the voltage regulator may be formed to be quite accurate using conventional techniques. As to the capacitor ratio, it is relatively easy to match the temperature and voltage coefficients of capacitors formed on a single silicon chip so that these coefficients track each other over a relatively wide range of temperature and voltage. Thus it is possible to obtain a desired ratio of the capacitors accurate to within ±0.1%, even though the absolute values of the capacitors may vary substantially from target values.

Assuming that divider 26 is not included on the output of the hysteresis comparator and that the output pulses are supplied directly to the register/display RD, it is convenient to select $T_q = 1$, sec. This may be accomplished by appropriate selection of the ratio C1/C2. However, this leads to certain difficulties, as will now be explained.

As noted above, it is desirable that the clock frequency $f_{cl}$ be much larger than the sampling frequency $f_s$ in order to obtain adequate information over one sampling period of $v_z$. An additional requirement on the switched-capacitor integrator for good linearity is $$2A_O\ (C1/C2)\ (1/f_{c1}) >> T_q/2 \qquad (3)$$

where $A_O$ is the open loop gain of the operational amplifier 32, and $T_q/2$ is the up (or down) integration time equal to one-half of the period of the output pulses from the hysteresis comparator 40. From Equation (3), for a 0.1% integration non-linearity, the capacitor ratio most be about $$C1/C2 = 10^3(T_q/2)\ (f_{cl}/2A_O) \qquad (4)$$

Thus, for an open loop gain $A_O = 10$, an output pulse period $T_q = 1$ sec, and a clock frequency $f_{c1} = 30$ KHz, the ratio C1/C2 is of the order of 750. Thus, C1 must be much larger than C2, i.e., have a value 750 times that of C2, to give the required ratio. This ratio is prohibitively large for integration on a silicon chip to afford a reasonable chip size and to permit good matching between the capacitors. The larger the value of the capacitor, the larger the chip area necessary for its fabrication. When the capacitance ratio is large, matching becomes difficult because it is hard to maintain a desired ratio on a production basis. With small capacitances, e.g., 0.1 pf, fringe effects may be quite large in relation to those associated with larger value capacitors, e.g., 75 pf. This makes it difficult to control the value of the small capacitor, and the capacitance ratio may change greatly.

When the values of the capacitor are approximately the same order of magnitude, much closer matching between the capacitors and much better integration accuracy are possible. Thus, it is desirable to reduce the capacitance ratio.

The capacitance ratio may be reduced considerably by employing divider 26 at the output of hysteresis comparator 40 for dividing the output pulses from the hysteresis comparator by a factor of N. In order to maintain the same energy per output pulse and the same pulse rate as given by equations (1) and (2) to the register/display, the input pulse rate to the divider must be increased by the same factor N as the division ratio. This requires that the speed of the integrator be increased by the divider factor N and the capacitor ratio be reduced by the same factor. Increasing the integration speed by a factor of N causes the period of the output pulse train from the hysteresis comparator to decrease to $T_q/N$, and Equation (4) becomes $$C1/C2 = 10^3 (T_q/2)(f_{cl}/2A_O) \quad (4)$$

For the same values of open loop gain, $T_q$, and $f_{cl}$ as before, selecting the divider ratio $N=100$ gives a capacitor ratio $C1/C2=7.5$, which is a reasonable value for integration on a silicon chip and which permits very close matching of the capacitors and close control over the accuracy of the ratio.

Increasing the integration speed by using a divider is of particular interest in the case of balanced polyphase watthour metering where the $2\omega t$ components are nearly cancelled. In the case of a single phase meter, these components are preferably removed before the fast integration takes place. This may be accomplished by employing a low pass filter on the input of the switched-capacitor integrator.

The circuit of FIG. 1 affords automatic off$_s$ et error correction of system off$_s$ et voltages. This is accomplished since during the up-integration period $T_u$ of the signal $v_z$, system error voltages are integrated up, causing a time error of $+T_e$. However, when the integrator output voltage reaches the reference voltage level and hysteresis comparator 40 output voltage changes state, the input voltage $v_x$ to comparator 30 reverses polarity, as previously described, which causes polarity of the product signal $v_z$ to reverse so that the integrator integrates down during the down-integration interval $T_d$. Although the input signal $v_z$ to the integrator reverses polarity, the system off$_s$ et error voltage does not and causes a time error of $-T_e$. Therefore, during the total period $T_u+T_d$, the off$_s$ et time errors are subtracted and are thus automatically eliminated.

The circuit of FIG. 1 has been described in connection with metering energy consumption in a single phase electrical system. In order to meter energy consumption in a polyphase system, it is merely necessary to include, for each additional phase, input circuits such as 14 and 16 for receiving voltages proportional to the load voltage and load current in that phase, a time division multiplier such as 22 for multiplying the voltages together to form a product signal $v_z$ for the phase, and to provide a switched capacitor input network such as C2 and switches S3–S6. The switched capacitor outputs, i.e., switch S4 output, from each of the other phases may simply be connected together and supplied to the summing point (SP) of integrator operational amplifier 32, as shown in dotted lines in FIG. 1. This effectively adds together the product signals $v_z$ representative of the instantaneous power in each of the other phases and supplies the composite signal to the input of operational amplifier 32 for integration. The resulting output signal $v_c$ from the integrator then represents average power in the polyphase system, and the output pulses to the register and display 27 indicate the total energy consumption in the polyphase system. For metering polyphase power, it is not necessary that the time division multiplier of each phase include a separate triangular waveform sampling frequency generator 28. The same sampling frequency $V_T$ from generator 28 of FIG. 1 may be supplied in parallel to each of the comparators in the time division multipliers of the other phases corresponding to comparator 30. In addition, the output from hysteresis comparator 40 may be supplied in parallel to switches corresponding to switch S1 in each of the other phases, so that the polarities of the input voltages $v_x$ are all reversed simultaneously. These additional circuits required for polyphase monitoring may all be included on integrated circuit chip 12.

Figure 2:
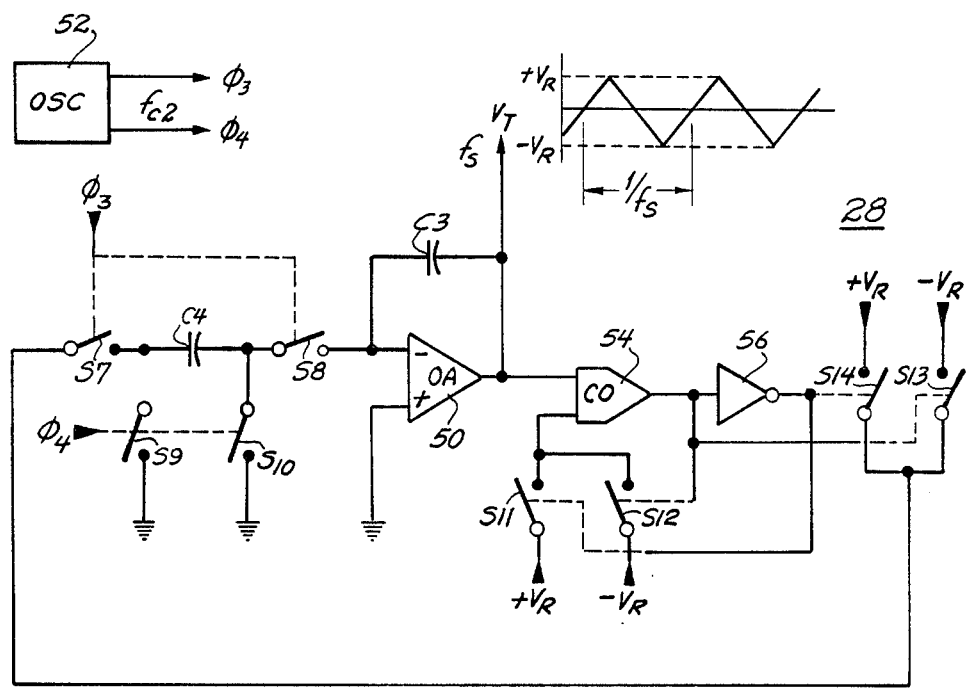
FIG. 2 is a schematic diagram of a triangular waveform sampling generator which may be employed in the circuit of FIG. 1.

FIG. 2 illustrates a preferred form of triangular waveform sampling generator 28. Other forms of the sampling frequency generator which may be employed are disclosed in the afore-referenced patents. However, the generators disclosed in these patents all employ RC integrators and are accompanied by the attendant disadvantages previously noted with respect to fabricating resistors on a semiconductor chip. The sampling frequency generator of FIG. 2 is advantageous in that it employs a switched-capacitor integrator, instead of an RC integrator, and it may be more easily fabricated on chip 12.

In FIG. 2, the switched-capacitor integrator of the sampling frequency generator comprises an operational amplifier 50 having a feedback capacitor C3 connected between its output and its non-inverting input, and a switched input capacitor C4 controlled by switches S7, S8, S9, and S10. As with the switched-capacitor integrator of FIG. 1, the switches may be controlled in pairs by nonoverlapping clock phases $\phi_3$ and $\phi_4$, which are 180 degrees out of phase. The clock phases may be derived from a non-critical clock oscillator 52 and may have a frequency $f_{c2}$ which is large in relation to the sampling frequency $f_s$, for example, 60 KHz. Oscillator 52 may be a separate oscillator similar to clock 34, for example, or alternatively clock 34 may be formed to provide clock signals at both frequencies $f_{cl}$ and $f_{c2}$.

The output of operational amplifier 50 may be coupled to one input of a comparator 54, the other input of which receives one of the reference voltages $+V_r$ or $-V_R$ in accordance with the closure of one of switches S11 and S12. The output signal of comparator 54 may be employed for controlling switch S12 and for controlling another switch S13, as shown, and may be supplied to an inverter amplifier 56, the output signal of which controls switch S11 and another switch S14. Switches S13 and S14 connect the reference voltages $-V_r$ and $+V_r$, respectively, to the input of switched-capacitor C4.

The sampling frequency generator of FIG. 2 functions in a manner similar to that previously described for the switched-capacitor integrator of FIG. 1. The integrator integrates one of the reference voltages (depending upon which of switches S13 and S14 is closed) to provide either an increasing or a decreasing triangularly-shaped ramp voltage $V_T$, as indicated by the waveform alongside the output lead from operational amplifier 50, which varies between the reference voltages with a time constant of $\pm(C3/C4)(1/f_{c2})$. When the output voltage from the integrator reaches either the positive or the negative value of the reference voltage, the output signal of comparator 54 changes state causing switches S11–S14 to be operated, which reverses polarity of the integrator input voltage so that the integrator begins to integrate in the opposite direction.

All of the various components illustrated within the dotted line 12 of FIG. 1 and in FIG. 2 may be readily implemented in a well-known manner in integrated circuit form. The various analog switches S1–S14, for example, may be implemented as conventional CMOS switches. Since the entire energy consumption metering circuit may be fabricated on a single integrated circuit chip, it may have a small size and may be produced rather inexpensively. The use of switched-capacitor integrators is particularly advantageous since, as indicated above, the ratios, voltage coefficients, and temperature coefficients of the capacitors may be well matched over a relatively wide temperature and voltage range. In fact, the temperature and voltage coefficients of integrated circuit capacitors are generally smaller than those of discrete components, and since the coefficients of integrated circuit capacitors can be matched quite well, fabrication of the metering circuit in integrated circuit form affords high accuracy metering of energy consumption. Also significant is the use of a divider, such as 26, at the output of the hysteresis comparator of the analog-to-pulse rate converter, since it enables the capacitor ratio of the switched-capacitor integrator to be reduced, thereby reducing the chip area required for fabricating the capacitors, improving the capacitor ratio matching, and affording a higher integration speed.

While a preferred embodiment of the invention has been shown and described, it will be appreciated by those skilled in the art that changes may be made in this embodiment without departing from the principles and spirit of the invention, the scope of which is defined in the appended claims.

What is claimed is:

1. An electronic circuit for measuring energy consumption in an electrical system comprising:
   input means for first and second signals representative, respectively, of current and voltage in the electrical system;
   multiplying means for multiplying the first and second signals to provide a product signal representative of power being supplied by the electrical system;
   said multiplying means comprising a time division multiplier including sampling means for sampling one of said first and second siganls and for providing samples proportional to the instantaneous value of current or voltage represented by said one signal, and switching means receiving the other of said first and second signals and an inverted form of said other signal, the switching means being controlled by said samples so as to switch between said other signal and the inverted form of said other signal to produce said product signal;
   said sampling means comprising sampling signal generating means for generating a triangular waveform sampling signal, and means for comparing the amplitude of said one of the first and second signals to the sampling signal to produce said samples, the samples comprising pulses having a pulse width that is proportional to said amplitude;
   said sampling signal generating means comprising a switched-capacitor integrator for providing at an output thereof said triangular waveform sampling signal, another switching means for alternately applying one of positive and negative reference voltages to an input of the switched-capacitor integrator, and comparator means for comparing the triangular waveform sampling signal from the switched-capacitor intergrator alternately with said one of the positive and negative reference voltages and for controlling said other switching means;
   switched-capacitor integrator means for integrating the product signal and for providing an integrated signal representative of average energy;
   converting means for converting the integrated signal into a first train of signal pulses; and
   divider means for dividing the first train of signal pulses by a preselected ratio and for providing a second train of output signal pulses, each output signal pulse representing a predetermined amount of electrical energy consumed in the electrical system, said switched-capacitor integrator means comprising an ampllifier having a first capacitor connected between an output and an input of the amplifier, a second capacitor, first switching means for alternately connecting the second capacitor to the multiplying means and to the input of said amplifier, second switching means for alternately connecting and disconnecting the second capacitor to and from ground, and clock generator means for supplying first and second clock signals for respectively controlling said first and second switching means, the clock signals being non-overlapped and out of phase, and the output signal of said amplifier being a ramp voltage having a time constant which is a function of the ratio of the values of said first capacitor to said second capacitor, said ratio of the values of said first capacitor of said second capacitor being inversely proportional to the preselected ratio by which said divider means divides said first train of pulses and limited to maintaining said first and second capacitor values within the same order of magnitude.

2. The circuit of claim 1, wherein all of said means are fabricated in integrated circuit form.

3. The circuit of claim 1, wherein said converting means comprises an analog-to-pulse rate converter for converting said ramp voltage into said first train of signal pulses, the analog-to-pulse rate converter comprising a hysteresis comparator for comparing said ramp voltage to positive and negative reference voltages.

4. The circuit of claim 3 further comprising means responsive to the pulses of said first train of signal pulses from said hysteresis comparator for alternately reversing the polarity of one of said first and second signals so as to automatically correct for offset errors.

5. The circuit of claim 1, wherein said divider means comprises a divider for dividing the pulse rate of said first train of signal pulses by said preselected ratio to provide said second train of output signal pulses, and wherein the speed of said switched-capacitor integrator is increased by said preselected ratio.

6. An electronic circuit for measuring energy consumption in an electrical system comprising, on a semiconductor chip:

input measn for first and second signals representative respectively, of current and voltage in the electrical system;

multiplying means for multiplying the first and second signlas together to provide a product signal representative of power supplied by the electrical system;

switched-capacitor integrator means for integrating the product signal to provide an integrated signal corresponding to the time integral of the product signal and representative of average energy;

said switched capacitor integrator means comprising an amplifier having a feedback capacitor connected between an output and an input of said amplifier, and an input capacitor alternately having one side switched to said input and the other side switched to the output of said multiplying means at a preselected clock frequency, said integrated signal being a ramp signal obtained at the output of said amplifier, the ramp signal having a time constant determined by a ratio of the values of said feedback capacitor to said input capacitor, and wherein said first converting means comprises means for comparing said ramp signal of a reference voltage, and means for producing said first train of pulses in response to the comparison;

first converting means for converting the integrated signal into a first train of pulses, each pulse of which reprsents a preselected fraction of a predetermined quantity of energy; and second converting means for converting the first train of pulses into a second train of pulses such that each pulse of the second train represents said predetermined quantity of energy and is indicaitve of energy consumption of such quantity in said electrical system, said second converting means being selected such that the values of said feedback capacitor and said input capacitor are of the same order of magnitude.

7. The circuit of claim 6 wherein said second converting means comprises a divider for dividing the pulse rate of said first train of pulses by a factor N, where 1/N corresponds to said preselected fraction.

8. The circuit of claim 7, wherein said ratio of capacitor values is selected to afford a time constant such that a pulse period of said first train of pulses from said comparing means is 1/N times a pulse period of said second train of pulses.

9. The circuit of claim 6 further comprising first and second switching means, said multiplying means comprising means for sampling one of said first and second signals to provide a pulse-width modulated signal having a pulse width proportional to an amplitude of said one signal, the pulse-width modulated signal controlling said first switching means which switches between the other of said first and second signals and an inverted form thereof to produce said product signal, and wherein said first train of pulses controls said second switching means to reverse the polarity of said one signal so as to cause the output signal of said switched-capacitor integrator to be integrated in an opposite direction and automatically cancel time errors due to system off$_s$et voltages.

10. The circuit of claim 6 wherein said electrical system comprises a plural phase AC power distribution system, said circuit further comprising, for each respective phase, input means for signals representative of the current and voltage in said each respective phase, multiplying means for providing a product signal representative of the power in said each respective phase, a switched input capacitor for sampling the product signal in said each respective phase, and means for supplying the sampled product signal from the switched input capacitor in said each respective phase to the input of said amplifier such that the integrated signal from said amplifier represents the average energy in said plural phase system and such tha each pulse of the second train of pulses indicates energy consumption in said plural phase system.

11. An electronic cirucit for measuring energy consumption in an electrical system comprising:

first input means for a first signal representative of current in the electrical system;

second input means for a second signal representative of voltage in the electrical system;

time division multiplier means for multiplying the first and second signals and providing a product signal representative of power being supplied by the electrical system;

switched-capacitor integrator means for integrating the product signal and for providing an integrated signal representative of average energy, the switched-capacitor integrator means comprising an amplifier having an input and an output, a first capacitor connected between the input and the output, a second capacitor, and switching means for alternately conencting one side of said second capacitor to the input of the amplifier and the other side of said second capacitor to an output of the time division multiplier means;

analog-to-pulse rate converter means for converting the integrated signwalk from the switched-capacitor integrated means into a first train of signal pulses; and divider means for dividng the first train of signal pulses by a preselected ratio chosen to maintain the values of said first and second capacitors of the same order of magnitude, said diver means providing a second train of output signal pulses wherein each output signal pulse represents a predetermined amount of electrical energy and is indicative of such amount of energy consumed in the electrical system.

12. The circuit of claim 11, wherein one of said first and second input means comprises a switch controlled by said first train of signal pulses for reversing polarity of the signal provided by said one of said first and second input means, and wherein amplitude of the integrated signal from said switched-capacitor integrator exhibits both a positive-going and negative-going ramp and the ratio of said first capacitor to said second capacitor is selected such that a pulse period of said first train of signal pulses is 1/N times a pulse period of said second train of signal pulses, where N is said preselected ratio.

13. The circuit of claim 11, wherein said time division multiplier means comprises a triangular waveform sampling frequency generator which includes another switched-capacitor integrator for producing a triangular waveform sampling signal having a frequency which is high in comparison to a frequency of said first and second signals, a comparator for comparing amplitude of one of said first and second signals to the triangular waveform sampling signal provided by said generator so as to produce a pulse-width modulated signal, and an analog switch controlled by said pulse-width modulated signal for switching between the other of said first and second signals and an inverted form thereof to form said product signal.

14. The circuit of claim 11, wherein said switching means for making connections to the second capacitor comprises a first pair of switches controlled by a first clock signal for connecting the second capacitor to the output of the multiplier means and to the input of said amplifier, and a second pair of switches controlled by a second clock signal which is non-overlapped and out of phase with said first clock signal for connecting said second capacitor to ground.

15. The circuit of claim 11, further comprising means for accumulating the signal pulses of said second pulse train and for indicating the total amount of energy consumed in said electrical system.

* * * * *